United States Patent
Li et al.

(10) Patent No.: US 12,295,175 B2
(45) Date of Patent: May 6, 2025

(54) METHOD FOR PRODUCING BACK-CONTACT SOLAR CELL ASSEMBLY AND BACK-CONTACT SOLAR CELL ASSEMBLY

(71) Applicant: LONGI SOLAR TECHNOLOGY (TAIZHOU) CO., LTD., Jiangsu (CN)

(72) Inventors: Hua Li, Jiangsu (CN); Jiyu Liu, Jiangsu (CN)

(73) Assignee: LONGI SOLAR TECHNOLOGY (TAIZHOU) CO., LTD., Jiangsu (CN)

( * ) Notice: Subject to any disclaimer, the term of this patent is extended or adjusted under 35 U.S.C. 154(b) by 195 days.

(21) Appl. No.: 17/638,946

(22) PCT Filed: Feb. 4, 2020

(86) PCT No.: PCT/CN2020/074297
§ 371 (c)(1),
(2) Date: Feb. 28, 2022

(87) PCT Pub. No.: WO2021/036201
PCT Pub. Date: Mar. 4, 2021

(65) Prior Publication Data
US 2022/0302328 A1     Sep. 22, 2022

(30) Foreign Application Priority Data

Aug. 26, 2019   (CN) .................. 201910791309.X
Aug. 26, 2019   (CN) .................. 201910792400.3

(51) Int. Cl.
*H10F 19/31*    (2025.01)
*B32B 3/30*     (2006.01)
(Continued)

(52) U.S. Cl.
CPC ............. *H10F 19/31* (2025.01); *B32B 3/30* (2013.01); *B32B 7/12* (2013.01); *B32B 15/043* (2013.01);
(Continued)

(58) Field of Classification Search
CPC ......... B32B 2457/12; B32B 3/30; B32B 7/12; B32B 15/043; B32B 37/12; B32B 38/145;
(Continued)

(56) References Cited

U.S. PATENT DOCUMENTS

2008/0236655 A1\*  10/2008  Baldwin ............. H01L 31/0516
                                                    228/256
2009/0032087 A1\*  2/2009   Kalejs ................. H01L 31/0516
                                                    136/246
(Continued)

FOREIGN PATENT DOCUMENTS

CN   103346181   10/2013
CN   103346202   10/2013
(Continued)

OTHER PUBLICATIONS

Machine translation of CN-109904268-A, Li. (Year: 2019).\*
(Continued)

*Primary Examiner* — Mayla Gonzalez Ramos
(74) *Attorney, Agent, or Firm* — Hodgson Russ LLP

(57) ABSTRACT

A method for producing a back-contacting solar-cell module and a back-contacting solar-cell module. The method includes: providing a first stacked member, wherein the first stacked member includes a first sheet member; a surface of the first sheet member is provided with a plurality of first electrically conducting sites; the first stacked member further includes electrically conducting protrusions that are formed on the first electrically conducting sites of the first sheet member, gluing and insulating space rings at the
(Continued)

peripheries of the first electrically conducting sites; providing a second stacked member, wherein the second stacked member includes a second sheet member; a surface of second sheet member is provided with a plurality of second electrically conducting sites; stacking and laminating first stacked member and second stacked member, the electrically conducting protrusions abut second electrically conducting sites, gluing and insulating space rings glue first sheet member and second sheet member together.

20 Claims, 9 Drawing Sheets

(51) Int. Cl.
| | | |
|---|---|---|
| B32B 7/12 | (2006.01) | |
| B32B 15/04 | (2006.01) | |
| B32B 37/12 | (2006.01) | |
| B32B 38/00 | (2006.01) | |
| H10F 19/90 | (2025.01) | |
| H10F 71/00 | (2025.01) | |

(52) U.S. Cl.
CPC ............ *B32B 37/12* (2013.01); *B32B 38/145* (2013.01); *H10F 19/908* (2025.01); *H10F 71/128* (2025.01); *B32B 2307/202* (2013.01); *B32B 2307/206* (2013.01); *B32B 2307/732* (2013.01); *B32B 2311/00* (2013.01); *B32B 2457/12* (2013.01)

(58) Field of Classification Search
CPC ............. H01L 31/1864; H01L 31/0516; H01L 31/046; H01L 31/0547; H01L 31/048; H01L 31/0504; H10F 19/908; H10F 19/31; H10F 71/128
See application file for complete search history.

(56) References Cited

U.S. PATENT DOCUMENTS

| | | | |
|---|---|---|---|
| 2011/0162701 A1 | 7/2011 | Truzzi et al. | |
| 2011/0192826 A1* | 8/2011 | Von Moltke | H01L 31/0516 219/121.64 |
| 2015/0090330 A1* | 4/2015 | Sewell | H01L 31/022425 438/98 |
| 2015/0303342 A1 | 10/2015 | Bultman et al. | |
| 2016/0111570 A1* | 4/2016 | Li | H01L 31/0547 438/66 |
| 2017/0104124 A1* | 4/2017 | Kim | B23K 35/362 |

FOREIGN PATENT DOCUMENTS

| | | |
|---|---|---|
| CN | 103646981 | 3/2014 |
| CN | 203967100 | 11/2014 |
| CN | 105283966 | 1/2016 |
| CN | 103346202 A | 6/2016 |
| CN | 107958943 | 4/2018 |
| CN | 109904268 A * | 6/2019 |
| CN | 110571305 | 12/2019 |
| CN | 110690295 | 1/2020 |
| CN | 110707170 | 1/2020 |

OTHER PUBLICATIONS

EPO, Extended European Search Report for EP Application No. 20858738.6, Aug. 9, 2023.
WIPO, International Search Report for PCT/CN2020/074297, Jun. 3, 2020.
CNIPA, First Office Action for CN Application No. 201910791309. X, Sep. 16, 2020.
CNIPA, Second Office Action for CN Application No. 201910791309. X, Apr. 19, 2021.
CNIPA, Third Office Action for CN Application No. 201910791309. X, Sep. 22, 2021.
CNIPA, First Office Action for CN Application No. 201910792400. 3, Sep. 16, 2020.
CNIPA, Second Office Action for CN Application No. 201910792400. 3, Apr. 20, 2021.
CNIPA, Third Office Action for CN Application No. 201910792400. 3, Sep. 22, 2021.

* cited by examiner

101 — providing a first stacked member, wherein the first stacked member comprises a first sheet member; the first sheet member is one of a metal circuit board or a back-contacting solar-cell sheet; a surface of the first sheet member is provided with a plurality of first electrically conducting sites; and the first stacked member further comprises electrically conducting protrusions that are formed on the first electrically conducting sites of the first sheet member 102 — providing a second stacked member, wherein the second stacked member comprises a second sheet member; the second sheet member is the other of the metal circuit board and the back-contacting solar-cell sheet; a surface of the second sheet member is provided with a plurality of second electrically conducting sites; and gluing and insulating space rings are provided at peripheries of the first electrically conducting sites or peripheries of the second electrically conducting sites 103 — stacking and laminating the first stacked member and the second stacked member, so that the electrically conducting protrusions abut the second electrically conducting sites, and the gluing and insulating space rings glue the first sheet member and the second sheet member together

FIG. 1

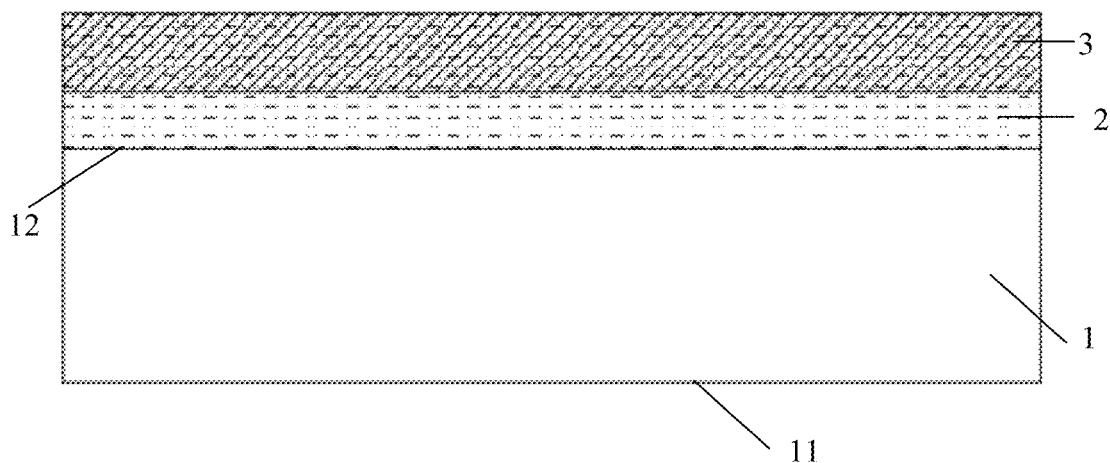

FIG. 2

METHOD FOR PRODUCING BACK-CONTACT SOLAR CELL ASSEMBLY AND BACK-CONTACT SOLAR CELL ASSEMBLY

The present disclosure is a U.S. national stage entry of International Patent Application No. PCT/CN2020/074297, filed Feb. 4, 2020, which claims priority to Chinese Patent Application No. 201910791309.X, filed Aug. 26, 2019, and Chinese Patent Application No. 201910792400.3, filed Aug. 26, 2019, the entire disclosures of which are incorporated herein by reference.

TECHNICAL FIELD

The present disclosure relates to the technical field of solar photovoltaics, and particularly relates to a method for producing a back-contacting solar-cell module and a back-contacting solar-cell module, a computer program and a computer-readable medium.

BACKGROUND

Back-contacting solar-cell assemblies do not have main grid lines at the front face, and both of the cathode and the anode are arranged at the back face of the cell, which reduces shading, and effectively increases the short-circuited circuits of the cell, so as to increase the energy conversion efficiency of the module. Accordingly, back-contacting solar-cell assemblies have an extensive application prospect.

Currently, the methods for producing back-contacting solar-cell assemblies mainly comprise: Providing a conductive adhesive between the back-contacting solar-cell sheet and a metal circuit board, and, in the lamination process, realizing the electric connection and the adhesion between the back-contacting solar-cell sheet and the metal circuit board by using the conductive adhesive.

The above-described methods for producing back-contacting solar-cell assemblies comprise, in the lamination process, realizing the electric connection and the adhesion between the back-contacting solar-cell sheet and the metal circuit board by using the conductive adhesive, which results in that the electric connection is not reliable and has a low yield.

SUMMARY

The present disclosure provides a back-contacting solar-cell module, a method for producing a back-contacting solar-cell module, a computer program and a computer-readable medium, which aim at solving the problems of back-contacting solar-cell assemblies of an unreliable electric connection and a low yield.

According to the first aspect of the present disclosure, there is provided a method for producing a back-contacting solar-cell module, wherein the method comprises:

providing a first stacked member, wherein the first stacked member comprises a first sheet member; the first sheet member is one of a metal circuit board or a back-contacting solar-cell sheet; a surface of the first sheet member is provided with a plurality of first electrically conducting sites; and the first stacked member further comprises electrically conducting protrusions that are formed on the first electrically conducting sites of the first sheet member;

providing a second stacked member, wherein the second stacked member comprises a second sheet member; the second sheet member is the other of the metal circuit board and the back-contacting solar-cell sheet; a surface of the second sheet member is provided with a plurality of second electrically conducting sites; and gluing and insulating space rings are provided at peripheries of the first electrically conducting sites or peripheries of the second electrically conducting sites, and an inner-ring shape of each of the gluing and insulating space rings matches with a shape of each of the electrically conducting protrusions; and stacking and laminating the first stacked member and the second stacked member, so that the electrically conducting protrusions abut the second electrically conducting sites, and the gluing and insulating space rings glue the first sheet member and the second sheet member together.

Optionally, a material of the gluing and insulating space rings is an insulative gluing material;
the insulative gluing material comprises a liquid binder and an inert filler; and
the inert filler comprises a silicon-dioxide particle.

Optionally, the silicon-dioxide particle is a gas-phase silicon-dioxide particle.

Optionally, the liquid binder comprises a siloxane; and a mass ratio of the inert filler to the liquid binder is 7:3 to 3:7.

Optionally, the first stacked member is obtained by using the following steps:
providing the first sheet member; and
printing an electrically conductive material onto the first electrically conducting sites of the first sheet member, to form the electrically conducting protrusions.

Optionally, before the step of stacking and laminating the first stacked member and the second stacked member, the method further comprises:
printing at the peripheries of the first electrically conducting sites of the first sheet member to form the gluing and insulating space rings; or, printing at the peripheries of the second electrically conducting sites of the second sheet member to form the gluing and insulating space rings.

Optionally, a thickness of the gluing and insulating space rings is 1 to 100 micrometers.

Optionally, before the step of stacking and laminating the first stacked member and the second stacked member, the method further comprises:
spray-coating a soldering flux onto a surface of the electrically conducting protrusions.

Optionally, neighboring instances of the gluing and insulating space rings have a gap therebetween.

Optionally, before the step of printing the electrically conductive material onto the first electrically conducting sites of the first sheet member, to form the electrically conducting protrusions, the method further comprises:
stacking sequentially an encapsulating material and a cover-plate material on a first side of the first sheet member, wherein the first side is opposite to one side of the first sheet member that is provided with the first electrically conducting sites; and
the step of printing the electrically conductive material onto the first electrically conducting sites of the first sheet member, to form the electrically conducting protrusions comprises:
by using the encapsulating material and the cover-plate material as a printing supporting substrate, printing the electrically conductive material onto the first electrically conducting sites of the first sheet member, to form the electrically conducting protrusions.

According to the second aspect of the present disclosure, there is provided a back-contacting solar-cell module, wherein the back-contacting solar-cell module comprises: a first stacked member and a second stacked member;

the first stacked member comprises a first sheet member;

the first sheet member is one of a metal circuit board or a back-contacting solar-cell sheet;

a surface of the first sheet member is provided with a plurality of first electrically conducting sites;

the first stacked member further comprises electrically conducting protrusions that are formed on the first electrically conducting sites of the first sheet member;

the second stacked member comprises a second sheet member;

the second sheet member is the other of the metal circuit board and the back-contacting solar-cell sheet than the first sheet;

a surface of the second sheet member is provided with a plurality of second electrically conducting sites;

gluing and insulating space rings are provided at peripheries of the first electrically conducting sites or peripheries of the second electrically conducting sites, and an inner-ring shape of each of the gluing and insulating space rings matches with a shape of each of the electrically conducting protrusions;

the first stacked member and the second stacked member are stacked and laminated together, and the electrically conducting protrusions abut the second electrically conducting sites; and the first sheet member and the second sheet member are glued together by using the gluing and insulating space rings.

According to the third aspect of the present disclosure, there is provided a computer program, wherein the computer program comprises a computer-readable code, and when the computer-readable code is executed in a calculating and processing device, the computer-readable code causes the calculating and processing device to implement the method for producing a back-contacting solar-cell module according to any one of the above items.

According to the fourth aspect of the present disclosure, there is provided a computer-readable medium, wherein the computer-readable medium stores the computer program stated above.

In the embodiments of the present disclosure, the method comprises providing a first stacked member, wherein the first stacked member comprises a first sheet member; the first sheet member is one of a metal circuit board or a back-contacting solar-cell sheet; a surface of the first sheet member is provided with a plurality of first electrically conducting sites; and the first stacked member further comprises electrically conducting protrusions that are formed on the first electrically conducting sites of the first sheet member; providing a second stacked member, wherein the second stacked member comprises a second sheet member; the second sheet member is the other of the metal circuit board and the back-contacting solar-cell sheet than the first sheet; a surface of the second sheet member is provided with a plurality of second electrically conducting sites; and gluing and insulating space rings are provided at peripheries of the first electrically conducting sites or peripheries of the second electrically conducting sites; and stacking and laminating the first stacked member and the second stacked member, so that the electrically conducting protrusions abut the second electrically conducting sites, and the gluing and insulating space rings glue the first sheet member and the second sheet member together. As compared with the prior art, in which the electric connection and the gluing between the metal circuit board and the back-contacting solar-cell sheet are realized by using a conductive adhesive in the lamination process, and the electric connection is realized mainly by the fusion of the conductive adhesive with the metal circuit board and the back-contacting solar-cell sheet in the lamination process, whereby the electric connection has a low reliability and a low yield. In the present disclosure, the first stacked member comprises the electrically conducting protrusions that are formed on the first electrically conducting sites of the first sheet member, the gluing and insulating space rings are provided at the peripheries of the first electrically conducting sites or the second electrically conducting sites, and the electric connection between the metal circuit board and the back-contacting solar-cell sheet is realized mainly by the stacking of the first stacked member and the second stacked member and the abutting of the electrically conducting protrusions to the second electrically conducting sites of the second sheet member, whereby a stable electric connection can be realized substantially without the fusion, which improves the reliability and the yield of the electric connection. In the lamination process, by pressing the first stacked member and the second stacked member, the electrically conducting protrusions and the second electrically conducting sites can be pressed tighter, which further improves the reliability and the yield of the electric connection.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work.

FIG. 1 shows a flow chart of the steps of the method for producing a back-contacting solar-cell module according to an embodiment of the present disclosure;

FIG. 2 shows a schematic structural diagram of the back-contacting solar-cell sheet according to an embodiment of the present disclosure;

DESCRIPTION OF THE REFERENCE NUMBERS

Figure 3:
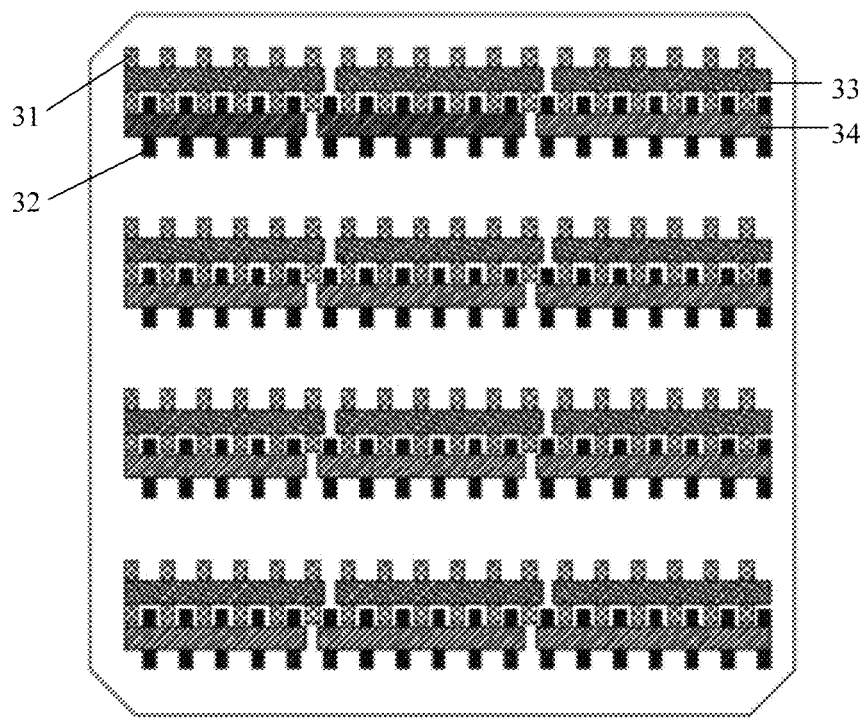
FIG. 3 shows a schematic structural diagram of the electrode according to an embodiment of the present disclosure.

1—silicon substrate, 2—doping diffusing region, 3—electrode, 11—surface of the silicon substrate that receives light, 8—gaps between the gluing and insulating space rings, 12—back face of the silicon substrate 1, 21—P-type doping diffusing regions, 22—N-type doping diffusing regions, 31—anode fine grid lines, 32—cathode fine grid lines, 33—anode-connected electrodes, 34—cathode-connected electrodes, 10—front cover-plate material, 20—front encapsulating material, 30—back-contacting solar-cell sheet, 40—gluing and insulating space rings, 41—electrically conducting protrusions, 42—inner rings of the gluing and insulating space rings, 50—metal circuit board, 60—rear encapsulating material, and 70—rear cover-plate material.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Referring to FIG. 1, FIG. 1 shows a flow chart of the steps of the method for producing a back-contacting solar-cell module according to an embodiment of the present disclosure.

Step 101: providing a first stacked member, wherein the first stacked member comprises a first sheet member; the first sheet member is one of a metal circuit board or a back-contacting solar-cell sheet; a surface of the first sheet member is provided with a plurality of first electrically conducting sites; and the first stacked member further comprises electrically conducting protrusions that are formed on the first electrically conducting sites of the first sheet member.

In an embodiment of the present disclosure, the first stacked member includes a first sheet member. The first sheet member is one of a metal circuit board or a back-contacting solar-cell sheet. For example, the first sheet member may be a metal circuit board. Alternatively, the first sheet member may be a back-contacting solar-cell sheet. The quantity of the back-contacting solar-cell sheets is not particularly limited, and the back-contacting solar-cell sheets may have substantially the same current characteristics or voltage characteristics, which is particularly set according to the demand of the back-contacting solar-cell module.

In an embodiment of the present disclosure, the back-contacting solar-cell sheet may be a solar-cell sheet in which the front face does not have a main grid line and both of the cathode and the anode are provided at the back face. In an embodiment of the present disclosure, the back-contacting solar-cell sheet may be an IBC cell, a MWT cell, a EWT cell and so on.

Referring to FIG. 2, FIG. 2 shows a schematic structural diagram of the back-contacting solar-cell sheet according to an embodiment of the present disclosure. In FIG. 2, 1 may be a silicon substrate, 2 may be a doping diffusing region, and 3 may be an electrode. 11 may be the surface that receives light; in other words, 11 is the front face of the silicon substrate 1. 12 may be the back face of the silicon substrate 1. The doping diffusing region 2 and the electrode 3 are provided sequentially at the back face of the silicon substrate 1.

Referring to FIG. 3, FIG. 3 shows a schematic structural diagram of the electrode according to an embodiment of the present disclosure. The electrode 3 may include anode fine grid lines 31, cathode fine grid lines 32, anode-connected electrodes 33 and cathode-connected electrodes 34. The cathode-connected electrodes 34 and the cathode fine grid lines 32 are electrically connected, and the anode-connected electrodes 33 and the anode fine grid lines 31 are electrically connected. The cathode fine grid lines 32 and the anode fine grid lines 31 may be segmented fine grid lines or continuous fine grid lines. The cathode-connected electrodes 34 may be connected to all or some of the cathode fine grid lines 32 in the same one row or the same one column, and the anode-connected electrodes 33 may be connected to all or some of the anode fine grid lines 31 in the same one row or the same one column. The cathode fine grid lines 32 may electrically contact a P-type doping diffusing region, and the anode fine grid lines 31 may electrically contact a N-type doping diffusing region.

Figure 4:
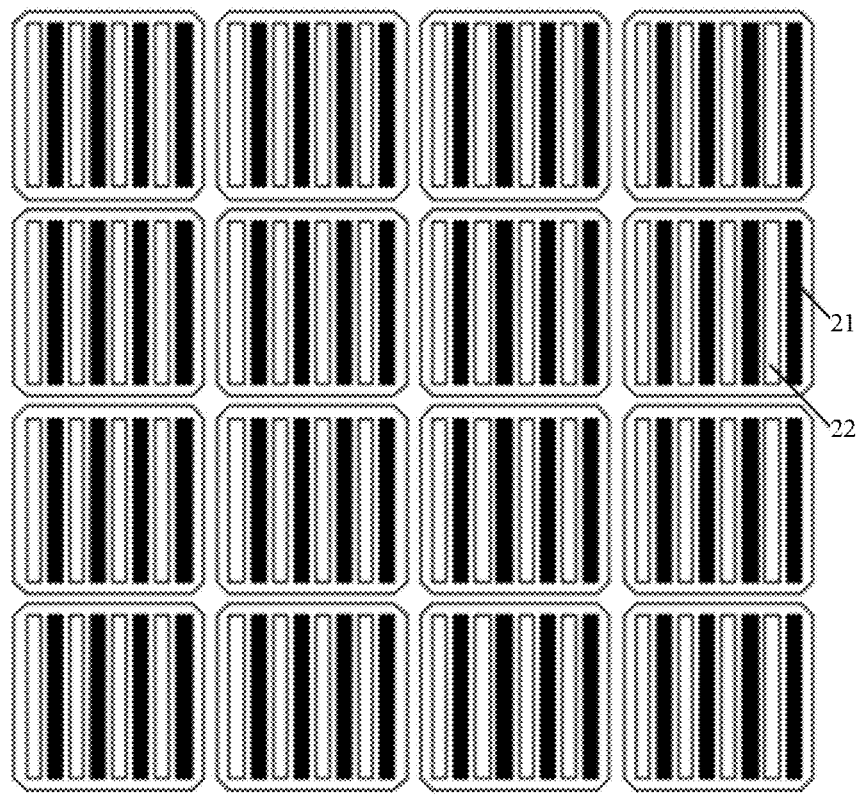
FIG. 4 shows a schematic structural diagram of the doping diffusing region according to an embodiment of the present disclosure.

Referring to FIG. 4, FIG. 4 shows a schematic structural diagram of the doping diffusing region according to an embodiment of the present disclosure. The doping diffusing region 2 may include P-type doping diffusing regions 21 and N-type doping diffusing regions 22. The P-type doping diffusing regions 21 and the N-type doping diffusing regions 22 may be arranged alternately.

In an embodiment of the present disclosure, the function of the metal circuit board is to collect the electric currents of the back-contacting solar-cell sheet, and so on. The metal circuit board may be a metal circuit board that has isolations formed by using a patterning treatment. The patterning treatment may be to remove part of the metal circuit board by using laser, chemical etching, mechanical cutting and so on to form gaps, the widths of the gaps may be greater than 50 micrometers, for example, 200 micrometers or higher. Some of the isolations of the metal circuit board are used for the subsequent connection to the P-type doping diffusing regions of the back-contacting solar-cell sheet. The other of the isolations of the metal circuit board are used for the subsequent connection to the N-type doping diffusing regions of the back-contacting solar-cell sheet. The isolations can effectively prevent subsequently the contacting between the cathodes and the anodes, to effectively prevent short circuiting.

In an embodiment of the present disclosure, the material of the metal circuit board may be at least one of copper, silver, aluminum, nickel, magnesium, iron, titanium, molybdenum, tungsten and an alloy thereof. For example, the material of the metal circuit board may be at least one simple substance of copper, silver, aluminum, nickel, magnesium, iron, titanium, molybdenum and tungsten. Alternatively, the material of the metal circuit board may be an alloy of at least two of copper, silver, aluminum, nickel, magnesium, iron, titanium, molybdenum and tungsten. Alternatively, the material of the metal circuit board may be the combination of at least one simple substance and at least one alloy.

In an embodiment of the present disclosure, the surface of the first sheet member is provided with a plurality of first electrically conducting sites. The first electrically conducting sites are mainly used to collect or export electric currents. If the first sheet member is the back-contacting solar-cell sheet, then the first electrically conducting sites may be the electrodes or the points to be connected of the electrodes at the shady face of the back-contacting solar-cell sheet. For example, the first electrically conducting sites may be the anode fine grid lines and the cathode fine grid lines at the shady face of the back-contacting solar-cell sheet. Alternatively, the first electrically conducting sites may be the anode-connected electrodes and the cathode-connected electrodes at the shady face of the back-contacting solar-cell sheet. If the first sheet member is the metal circuit board, then the first electrically conducting sites may be the positions on the surface of the metal circuit board that are electrically connected to the electrodes of the back-contacting solar-cell sheet. For example, the first electrically conducting sites may be the points on the surface of the metal circuit board that are electrically connected to the anode fine grid lines and the cathode fine grid lines at the shady face of the back-contacting solar-cell sheet. Alternatively, the first electrically conducting sites may be the points on the surface of the metal circuit board that are electrically connected to the anode-connected electrodes and the cathode-connected electrodes at the shady face of the back-contacting solar-cell sheet.

In an embodiment of the present disclosure, the first stacked member further includes electrically conducting protrusions that are formed on the first electrically conducting sites of the first sheet member. The function of the electrically conducting protrusions is mainly to electrically connect to the first electrically conducting sites on the first sheet member and the second electrically conducting sites on the second sheet member, to collect or export electric currents. The height of the electrically conducting protrusions is configured so that the first electrically conducting sites and the second electrically conducting sites can be electrically connected well. In an embodiment of the present disclosure, the height of the electrically conducting protrusions is not particularly limited.

In an embodiment of the present disclosure, the material of the electrically conducting protrusions may be at least one of a soldering paste, a tin cream, an isotropic conductive adhesive, an anisotropic conductive adhesive, an electrically conductive ink and an electrically conductive slurry.

Optionally, the electrically conducting protrusions may be circular or rectangular, which is not particularly limited in the embodiments of the present disclosure. The electrically conducting protrusions may include electrically conducting protrusions contacting the cathodes of the back-contacting solar-cell sheet and electrically conducting protrusions contacting the anodes of the back-contacting solar-cell sheet. Alternatively, the electrically conducting protrusions may include electrically conducting protrusions contacting the cathode fine grid lines of the back-contacting solar-cell sheet and electrically conducting protrusions contacting the anode fine grid lines of the back-contacting solar-cell sheet. Alternatively, the electrically conducting protrusions may include electrically conducting protrusions contacting the P-type doping diffusing regions of the back-contacting solar-cell sheet and electrically conducting protrusions contacting the N-type doping diffusing regions of the back-contacting solar-cell sheet.

Optionally, the quantity of the electrically conducting protrusions may be equal or unequal to the quantity of the first electrically conducting sites. The quantity of the electrically conducting protrusions corresponding to one single back-contacting solar-cell sheet may be 20-5000. The quantity of the electrically conducting protrusions corresponding to the whole back-contacting solar-cell module may be 1000-50000. The above quantities of the electrically conducting protrusions facilitate the collection and conduction of electric currents, and are not particularly limited in the embodiments of the present disclosure.

For example, if the first sheet member is one single back-contacting solar-cell sheet, then the one single back-contacting solar-cell sheet may include 20-5000 electrically conducting protrusions.

Step 102: providing a second stacked member, wherein the second stacked member comprises a second sheet member; the second sheet member is the other of the metal circuit board and the back-contacting solar-cell sheet; a surface of the second sheet member is provided with a plurality of second electrically conducting sites; and gluing and insulating space rings are provided at peripheries of the first electrically conducting sites or peripheries of the second electrically conducting sites.

In an embodiment of the present disclosure, the second sheet member may be the other one of the metal circuit board or the back-contacting solar-cell sheet than the first sheet member. For example, if the first sheet member is the metal circuit board, then the second sheet member may be the back-contacting solar-cell sheet. Alternatively, if the first sheet member is the back-contacting solar-cell sheet, then the second sheet member may be the metal circuit board.

In an embodiment of the present disclosure, the surface of the second sheet member is provided with a plurality of second electrically conducting sites. The second electrically conducting sites are mainly used to collect or export electric currents. If the second sheet member is the back-contacting solar-cell sheet, then the second electrically conducting sites may be the electrodes or the points to be connected of the electrodes at the shady face of the back-contacting solar-cell sheet. For example, the second electrically conducting sites may be the anode fine grid lines and the cathode fine grid lines at the shady face of the back-contacting solar-cell sheet. Alternatively, the second electrically conducting sites may be the anode-connected electrodes and the cathode-connected electrodes at the shady face of the back-contacting solar-cell sheet. If the second sheet member is the metal circuit board, then the second electrically conducting sites may be the positions on the surface of the metal circuit board that are electrically connected to the electrodes of the back-contacting solar-cell sheet. For example, the second electrically conducting sites may be the points on the surface of the metal circuit board that are electrically connected to the anode fine grid lines and the cathode fine grid lines at the shady face of the back-contacting solar-cell sheet. Alternatively, the second electrically conducting sites may be the points on the surface of the metal circuit board that are electrically connected to the anode-connected electrodes and the cathode-connected electrodes at the shady face of the back-contacting solar-cell sheet.

In an embodiment of the present disclosure, gluing and insulating space rings are provided at the peripheries of the first electrically conducting sites on the first sheet member, or, gluing and insulating space rings are provided at the peripheries of the second electrically conducting sites on the second sheet member. It is not particularly limited the peripheries of which of the electrically conducting sites the gluing and insulating space rings are provided at.

The functions of the gluing and insulating space rings may mainly be: Isolating the electrically conducting protrusions, to prevent short circuiting between the electrically conducting protrusions; and gluing the first sheet member and the second sheet member in the lamination process. In addition, in certain cases, they provide certain thermal conductivity, hydrophobicity and so on, which is not particularly limited in the embodiments of the present disclosure.

The quantity of the gluing and insulating space rings may be equal to the quantity of the electrically conducting protrusions that are snap-fitted thereto subsequently. The shape of the inner rings of the gluing and insulating space rings may match with the shape of the electrically conducting protrusions that are snap-fitted thereto subsequently. Those are not particularly limited in the embodiments of the present disclosure.

In an embodiment of the present disclosure, optionally, the thickness of the gluing and insulating space rings may be 1 to 100 micrometers. As compared with the prior art, in which polyolefin and so on are used and thicknesses above 150 micrometers are formed, not only the thickness of the back-contacting solar-cell module is reduced, but also the gluing and insulating space rings of such thicknesses, in the subsequent lamination process, have a good gluing reliability, a good thermal conductivity, a good hydrophobicity and so on.

In an embodiment of the present disclosure, optionally, the material of the gluing and insulating space rings is an insulative gluing material. The insulative gluing material may include a liquid binder and an inert filler. The inert filler includes a silicon-dioxide particle. The gluing and insulating space rings of the above material do not only have a low cost, but also have a good gluing property, a good thermal conductivity and so on.

Particularly, the insulative gluing material may include a liquid binder and an inert filler. The inert filler may further include a silicon-dioxide particle. By using the silicon-dioxide particle, not only the cost is low, but also the insulative gluing material has a good gluing property, a good thermal conductivity and so on, which in turn facilitates to reduce the production cost of the back-contacting solar-cell module, and improve the gluing reliability, the thermal conductivity and so on. By providing the liquid binder in the insulative gluing material, the gluing reliability and so on can be further improved.

In an embodiment of the present disclosure, optionally, the silicon-dioxide particle is a gas-phase silicon-dioxide particle. Particularly, the gas-phase silicon-dioxide particle is smaller, has a good dispersibility, and does not easily precipitate, which can provide a better gluing property, a low cost and a good thermal conductivity. Moreover, the gas-phase silicon-dioxide particle has a good hydrophobicity, which can reduce or prevent the remaining of moisture in the fabrication process of the back-contacting solar-cell module to a large extent, to improve the reliability of the back-contacting solar-cell module.

In an embodiment of the present disclosure, optionally, the inert filler may further include at least one of an aluminium oxide particle, talc and a boron nitride particle. Those materials can further reduce the production cost of the back-contacting solar-cell module, and improve the gluing reliability, the thermal conductivity and so on.

The liquid binder mainly serves for adhesion. In an embodiment of the present disclosure, optionally, the liquid binder includes a siloxane. Particularly, the siloxane can enable the gluing and insulating space rings obtained by printing to be more compact, can increase the hydrophobicity of the gluing and insulating space rings, can reduce or prevent the remaining of moisture in the fabrication process of the back-contacting solar-cell module to a larger extent, to improve the reliability of the back-contacting solar-cell module.

Optionally, the mass ratio of the inert filler to the liquid binder is 7:3 to 3:7. The gluing and insulating space rings accordingly formed have a lower cost, and have better gluing reliability, thermal conductivity, hydrophobicity and so on. For example, the mass ratio of the inert filler to the liquid binder in the insulative gluing material is 6:4.

In an embodiment of the present disclosure, optionally, the liquid binder further includes at least one of an organic solvent, a resin, a curing agent, a colorant, a wetting agent and a dispersant. Particularly, the organic solvent may be 1,4-butanediol diglycidyl ether, dibutyl phthalate and so on. The resin may be a thermosetting resin, a thermoplastic resin and so on. The thermosetting resin may be unsaturated polyester, vinyl ester, epoxy, phenolic aldehyde, bismaleimide (BMI), polyimide resin and so on. The thermoplastic resin may be polypropylene (PP), polycarbonate (PC), nylon (NYLON), polyetheretherketone (PEEK), polyether sulfone (PES) and so on. The dispersant may be used to improve the dispersibility of the insulative gluing material, to homogenize the property, improve the fluidity and so on. The curing agent can improve the property of sag prevention, to improve the moulding of the gluing and insulating space rings after the printing, and so on. The colorant can enable the insulative gluing material to have a specific color, to facilitate the subsequent identification, checking and so on. Those are not particularly limited in the embodiments of the present disclosure.

As an example, by mass ratio, the composition of the material of the gluing and insulating space rings may be: 50% of the silicon-dioxide particle, 10% of the siloxane, 30% of 1,4-butanediol diglycidyl ether and 10% of vinyl ester.

As another example, by mass ratio, the composition of the material of the gluing and insulating space rings may be: 50% of the silicon-dioxide particle, 9% of the siloxane, 20% of 1,4-butanediol diglycidyl ether, 110% of dibutyl phthalate and 10% of polyetheretherketone.

In an embodiment of the present disclosure, the neighboring gluing and insulating space rings may not have a gap therebetween. In other words, the gaps between the gluing and insulating space rings are also formed by the insulative gluing material and so on, whereby the gluing property of the first sheet member and the second sheet member is better.

Figure 5:
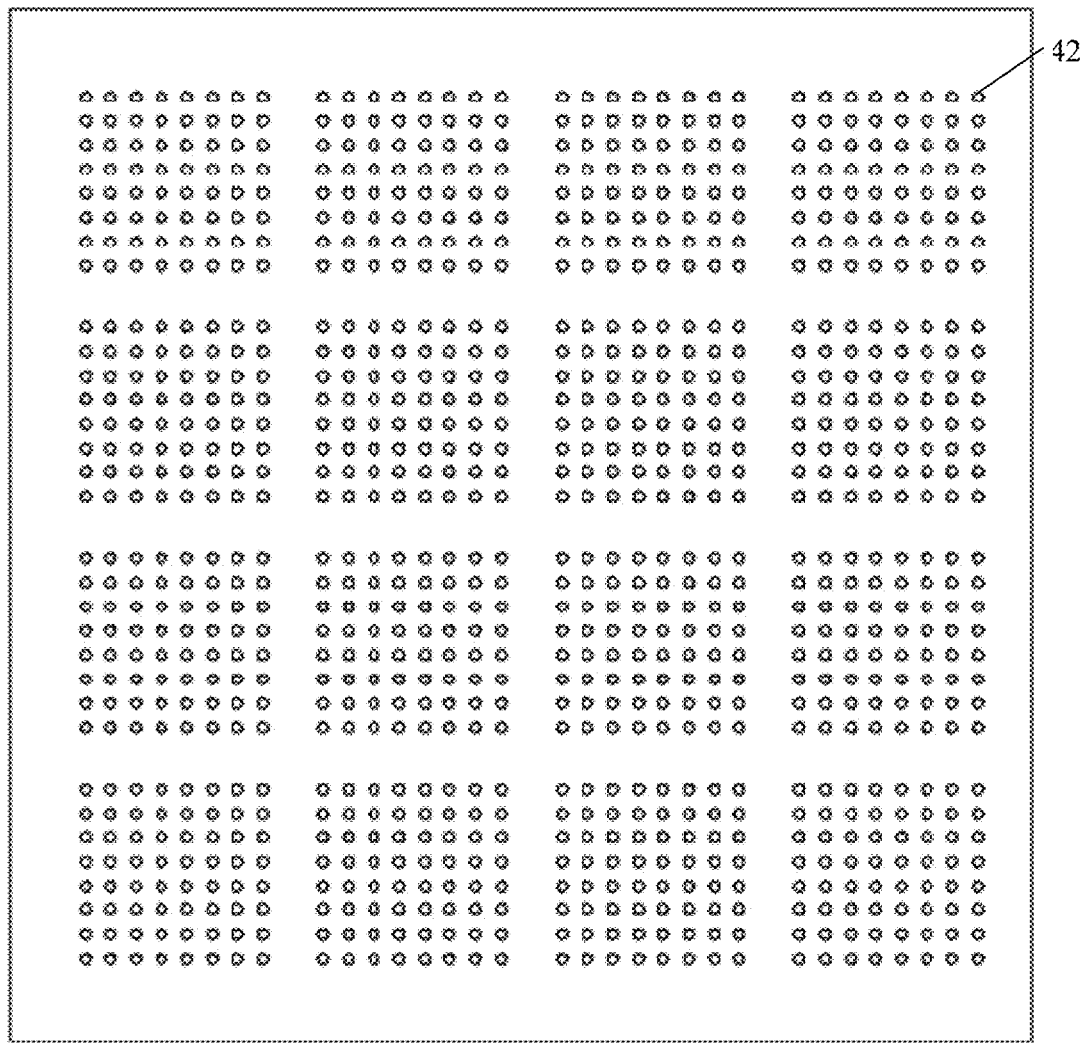
FIG. 5 shows a schematic structural diagram of the gluing and insulating space rings according to an embodiment of the present disclosure.

For example, referring to FIG. 5, FIG. 5 shows a schematic structural diagram of the gluing and insulating space rings according to an embodiment of the present disclosure. 42 in FIG. 5 may be the inner rings of the gluing and insulating space rings, and the whole of the other part outside the inner rings 42 may be formed by the insulative gluing material and so on.

In an embodiment of the present disclosure, optionally, the neighboring gluing and insulating space rings have a gap therebetween. Particularly, the spaces between the gluing and insulating space rings are empty, and are not provided with the insulative gluing material and so on. Accordingly, the consumption of the insulative gluing material is lower, and the production cost is lower.

Figure 6:
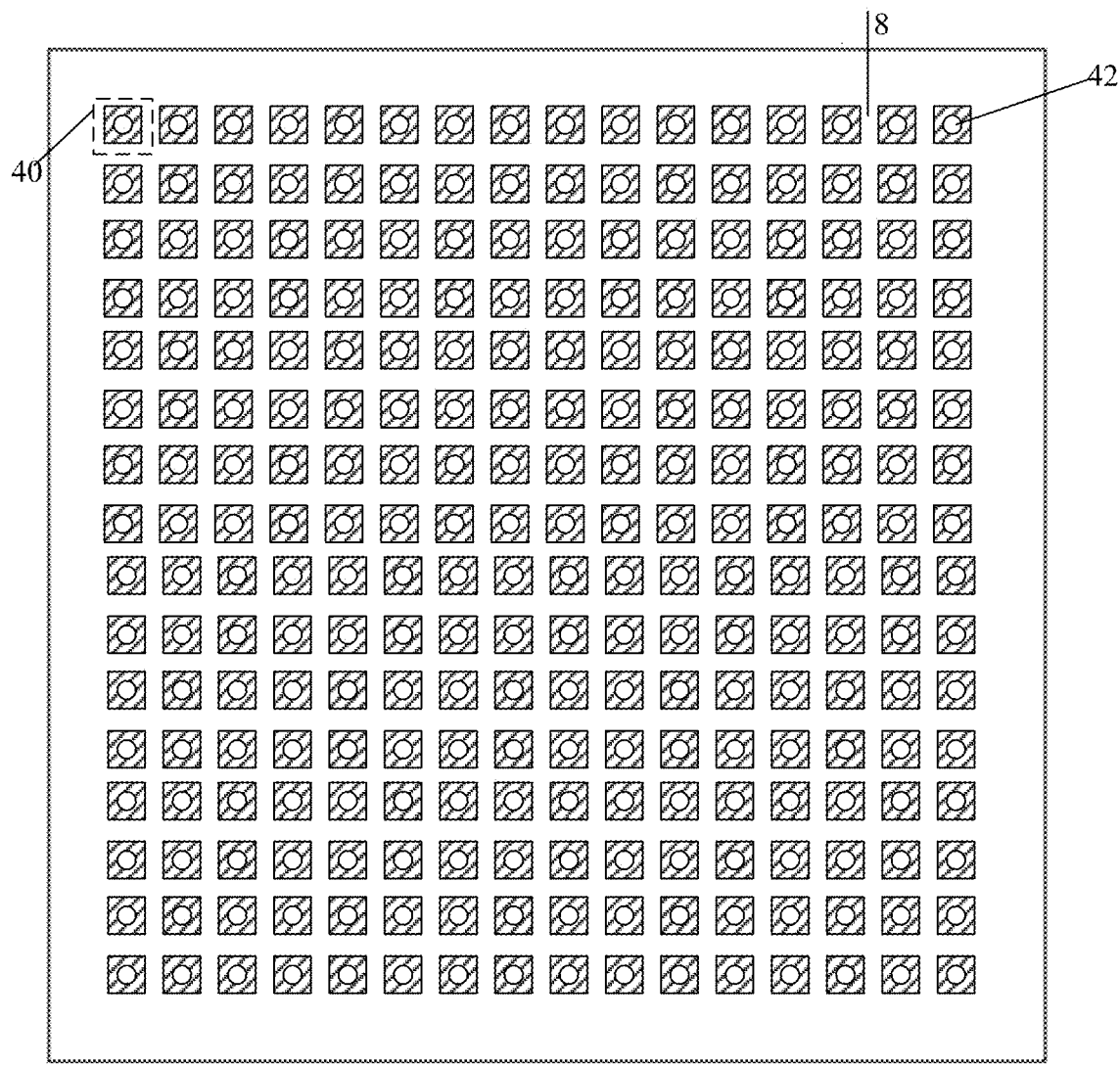
FIG. 6 shows a schematic structural diagram of the gluing and insulating space rings according to another embodiment of the present disclosure.

For example, referring to FIG. 6, FIG. 6 shows a schematic structural diagram of the gluing and insulating space rings according to another embodiment of the present disclosure. 40 encircled by the dotted-line rectangular block may be one gluing and insulating space ring. 42 may be the inner rings of the gluing and insulating space rings. The neighboring gluing and insulating space rings 40 have a gap 8 therebetween; in other words, the neighboring gluing and insulating space rings 40 are not provided with the insulative gluing material and so on therebetween.

In the practical production process, regarding whether the neighboring gluing and insulating space rings have a gap therebetween, one or the combination of the above two modes may be selected by balancing the gluing reliability, the production cost and so on, which is not particularly limited in the embodiments of the present disclosure. For example, optionally, some of the neighboring gluing and insulating space rings have a gap therebetween, and some of the neighboring gluing and insulating space rings do not have a gap therebetween.

In an embodiment of the present disclosure, the step 101 and the step 102 may be executed synchronously. Alternatively, the step 101 is executed firstly and the step 102 is executed subsequently. Alternatively, the step 102 is executed firstly and the step 101 is executed subsequently. Those are not particularly limited in the embodiments of the present disclosure. In an embodiment of the present disclosure, both of the first stacked member and the second stacked member may further include an encapsulating material and a cover-plate material. The encapsulating material and the cover-plate material may be provided sequentially on the side of the first sheet member or the second sheet member that is further from the electrically conducting sites. The encapsulating material may include sealing materials such as EVA and polyolefin. The cover-plate material may be a toughened-glass cover plate or a polymer cover plate such as TPT, TPE, KPE, KPK, KPC and KPF. The encapsulating material and the cover-plate material may be hot-pressed, bonded and so on therebetween. It should be noted that both of the encapsulating material and the cover-plate material that are located on the side of the first sheet member or the second sheet member that receives light may have a good light transmittance.

Step 103: stacking and laminating the first stacked member and the second stacked member, so that the electrically conducting protrusions abut the second electrically conducting sites, and the gluing and insulating space rings glue the first sheet member and the second sheet member together.

In an embodiment of the present disclosure, the second stacked member and the first stacked member are stacked and laminated, and the electrically conducting protrusions abut the second electrically conducting sites, to realize the electric contacting between the electrically conducting protrusions and the second sheet member. The gluing and insulating space rings glue the first sheet member and the second sheet member together.

Particularly, the side of the first sheet member that is provided with the electrically conducting protrusions is adhered to the side of the second sheet member that is provided with the second electrically conducting sites, so that the electrically conducting protrusions abut the second electrically conducting sites, to in turn realize the electric contacting between the first sheet member and the second sheet member. The first electrically conducting sites electrically contact the electrically conducting protrusions, and the electrically conducting protrusions abut the second electrically conducting sites to realize the electric contacting between the first electrically conducting sites and the second electrically conducting sites, to in turn realize the functions of current collection and conduction.

The first stacked member and the second stacked member are stacked and laminated, and the gluing and insulating space rings, in the lamination process, cross-link glue the first sheet member and the second sheet member, to glue the first sheet member and the second sheet member together, to obtain the back-contacting solar-cell module. The gluing and insulating space rings are used to, in the lamination process, glue the first sheet member and the second sheet member.

In an embodiment of the present disclosure, it should be noted that the electrically conducting protrusions substantially do not have physical or chemical changes in the process of stacking and lamination. The electric connection between the metal circuit board and the back-contacting solar-cell sheet is realized mainly by the abutting of the electrically conducting protrusions to the second electrically conducting sites. As compared with the prior art, in which the electric connection between the metal circuit board and the back-contacting solar-cell sheet is realized by the fusion of the conductive adhesive with the electrically conducting sites on the metal circuit board and the back-contacting solar-cell sheet in the lamination process, whereby the electric connection has a low reliability and a low yield. In the present disclosure, the electric connection between the metal circuit board and the back-contacting solar-cell sheet is realized mainly by the abutting of the electrically conducting protrusions to the second electrically conducting sites of the second sheet member, whereby a stable electric connection can be realized without the fusion, which improves the reliability and the yield of the electric connection. In the lamination process, by pressing the first stacked member and the second stacked member, the electrically conducting protrusions and the second electrically conducting sites can be pressed tighter, which further improves the reliability and the yield of the electric connection.

Figure 7:
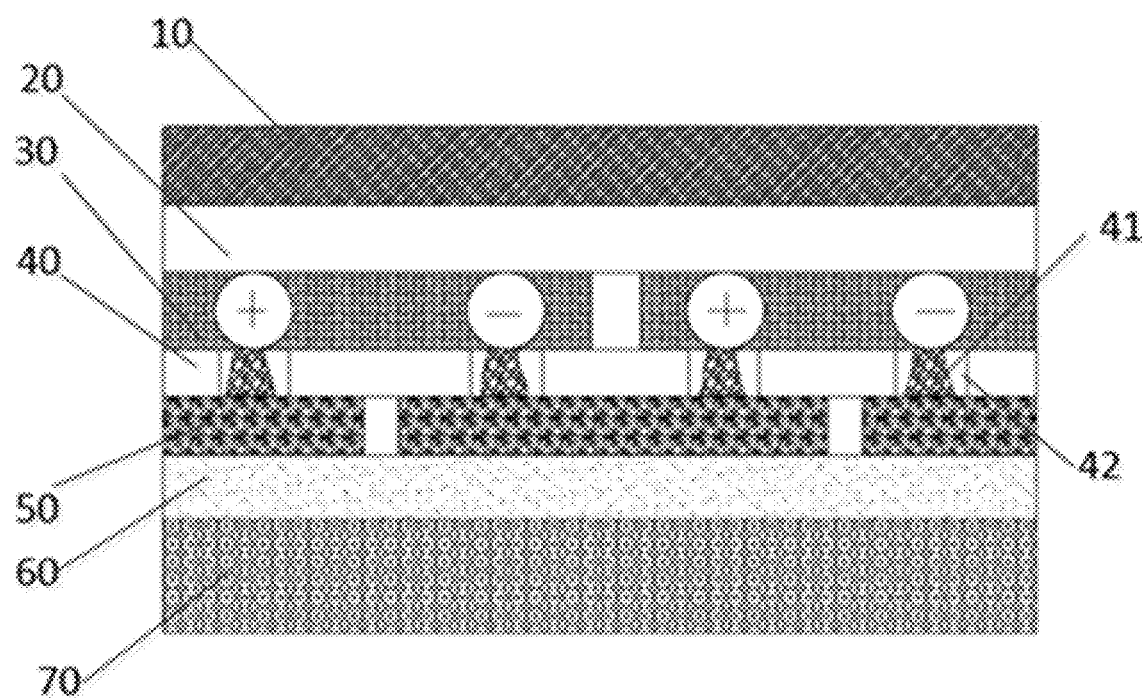
FIG. 7 shows a schematic structural diagram of the back-contacting solar-cell module according to an embodiment of the present disclosure.

Referring to FIG. 7, FIG. 7 shows a schematic structural diagram of the back-contacting solar-cell module according to an embodiment of the present disclosure. In FIG. 7,10 may be a front cover-plate material; 20 may be a front encapsulating material, and, for example, may be a light transmitting EVA or POE; 30 may be the back-contacting solar-cell sheet; 40 may be the gluing and insulating space rings; 41 may be the electrically conducting protrusions; 42 may be the inner rings of the gluing and insulating space rings; 50 may be the metal circuit board; 60 may be a rear encapsulating material; and 70 may be a rear cover-plate material. The front cover-plate material 10 may be the side of the back-contacting solar-cell module that receives light. The rear cover-plate material 70 may be the side of the back-contacting solar-cell module that is further from the light. The front cover-plate material 10 and the front encapsulating material 20 may have a good light transmittance.

In an embodiment of the present disclosure, as compared with the prior art, in which the electric connection and the gluing between the metal circuit board and the back-contacting solar-cell sheet are realized by using a conductive adhesive in the lamination process, and the electric connection is realized mainly by the fusion of the conductive adhesive with the metal circuit board and the back-contacting solar-cell sheet in the lamination process, whereby the electric connection has a low reliability and a low yield. In the present disclosure, the first stacked member includes the electrically conducting protrusions that are formed on the first electrically conducting sites of the first sheet member, and the electric connection between the metal circuit board and the back-contacting solar-cell sheet is realized mainly by the stacking of the first stacked member and the second stacked member and the abutting of the electrically conducting protrusions to the second electrically conducting sites of the second sheet member, whereby a stable electric connection can be realized substantially without the fusion, which improves the reliability and the yield of the electric connection. In the lamination process, by pressing the first stacked member and the second stacked member, the electrically conducting protrusions and the second electrically conducting sites can be pressed tighter, which further improves the reliability and the yield of the electric connection.

Figure 8:
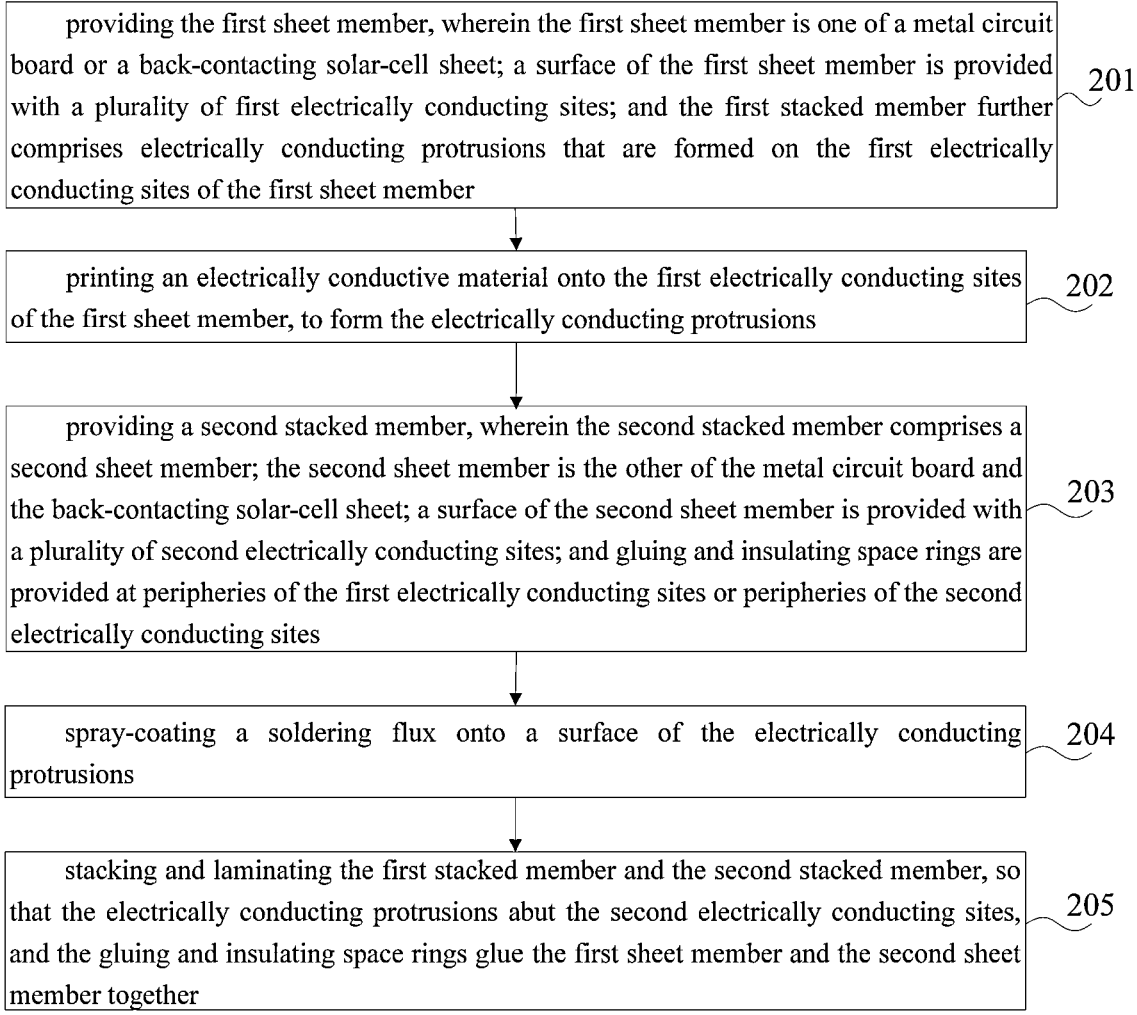
FIG. 8 shows a flow chart of the steps of the method for producing a back-contacting solar-cell module according to another embodiment of the present disclosure.

In an embodiment of the present disclosure, referring to FIG. 8, FIG. 8 shows a flow chart of the steps of the method for producing a back-contacting solar-cell module according to another embodiment of the present disclosure.

Step 201: providing the first sheet member, wherein the first sheet member is one of a metal circuit board or a back-contacting solar-cell sheet; a surface of the first sheet member is provided with a plurality of first electrically conducting sites; and the first stacked member further comprises electrically conducting protrusions that are formed on the first electrically conducting sites of the first sheet member.

In the step 201, the first sheet member, the first electrically conducting sites, the electrically conducting protrusions, the gluing and insulating space rings and so on may refer to the particular descriptions on the step 101, and, in order to avoid replication, are not discussed here further.

In an embodiment of the present disclosure, optionally, before the following step 202, the method may further include: stacking sequentially an encapsulating material and a cover-plate material on a first side of the first sheet member, wherein the first side is opposite to one side of the first sheet member that is provided with the first electrically conducting sites.

Particularly, the first side of the first sheet member is the side opposite to the side of the first sheet member that is provided with the first electrically conducting sites. For example, if the first sheet member is the back-contacting solar-cell sheet and the first electrically conducting sites are located on the side of the back-contacting solar-cell sheet that is further from the light, then the first side may be the side of the first sheet member that receives light. For example, if the first sheet member is the metal circuit board, then the first electrically conducting sites are located on the side of the metal circuit board that receives light, and the first side may be the side of the metal circuit board that is further from the light. The encapsulating material may be firstly stacked on the first side of the first sheet member, and subsequently the cover-plate material may be stacked.

Figure 9:
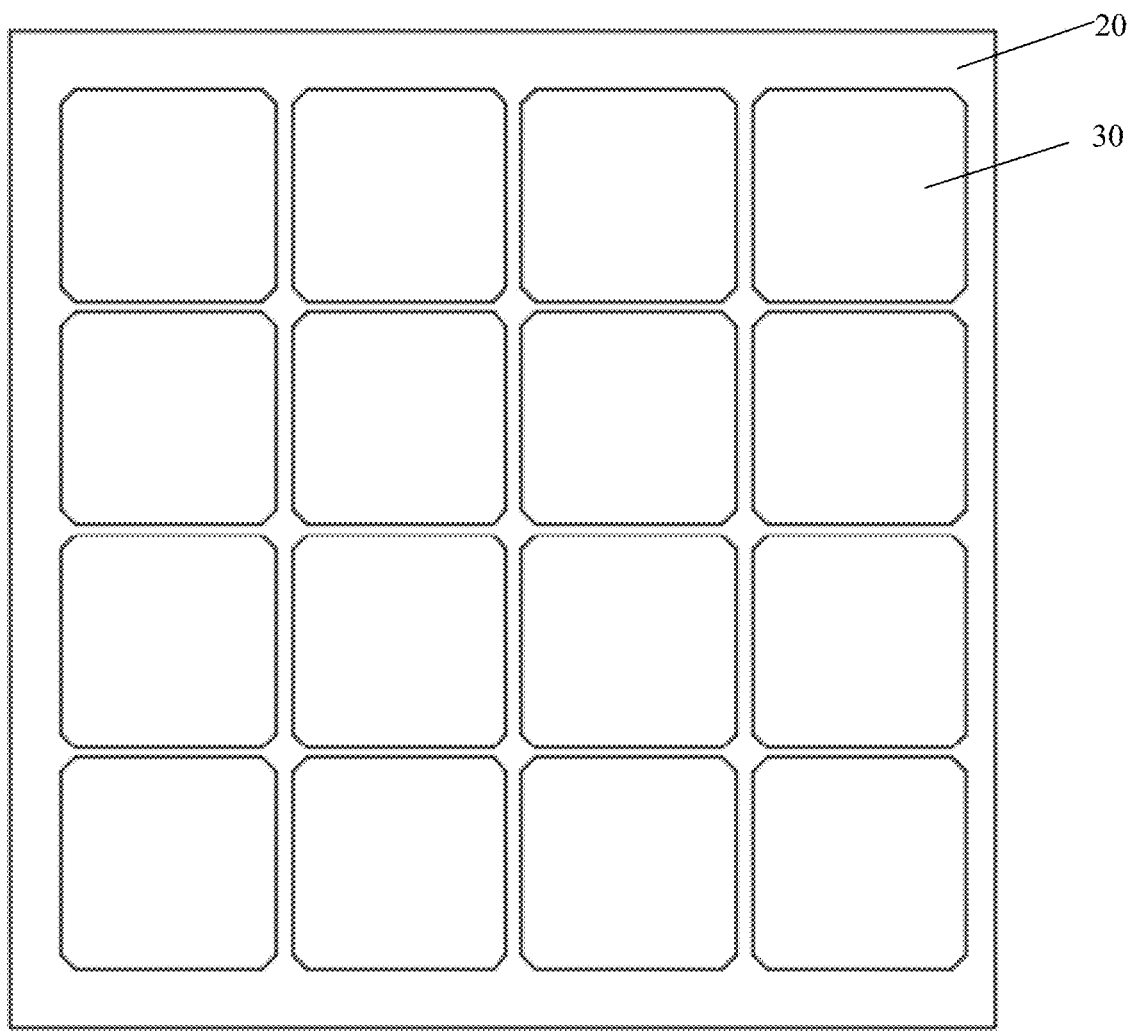
FIG. 9 shows a schematic structural diagram of the stacking of the encapsulating material on the first side of the first sheet member according to an embodiment of the present disclosure.

Referring to FIG. 9, FIG. 9 shows a schematic structural diagram of the stacking of the encapsulating material on the first side of the first sheet member according to an embodiment of the present disclosure. The first sheet member may be a back-contacting solar-cell sheet 30. Because the encapsulating material is located on the side of the back-contacting solar-cell sheet that receives light, the encapsulating material may be the front encapsulating material 20.

Step 202: printing an electrically conductive material onto the first electrically conducting sites of the first sheet member, to form the electrically conducting protrusions.

In an embodiment of the present disclosure, before the step 202, a printing screen corresponding to the first electrically conducting sites may be fabricated. The electrically conductive material may be printed onto the first electrically conducting sites of the first sheet member by modes such as screen printing and ink-jet printing to form the electrically conducting protrusions, to obtain the first stacked member. Such printing modes can realize full-screen printing, to increase the production efficiency.

For example, if the first sheet member is the metal circuit board, then the electrically conductive material is printed onto the first electrically conducting sites of the metal circuit board to form the electrically conducting protrusions. If the first sheet member is the back-contacting solar-cell sheet, then the electrically conductive material is printed onto the first electrically conducting sites of the back-contacting solar-cell sheet to form the electrically conducting protrusions. For example, full-screen printing may be performed, wherein the electrically conductive material is printed onto the first electrically conducting sites of 100 back-contacting solar-cell sheets in one step to form the electrically conducting protrusions, and it is not required to print the electrically conductive material separately onto the first electrically conducting sites of each of the back-contacting solar-cell sheets to form the electrically conducting protrusions, which increases the production efficiency.

In an embodiment of the present disclosure, if the gluing and insulating space rings are provided at the peripheries of the first electrically conducting sites, then, before the step 202, a space-ring printing screen corresponding to the first electrically conducting sites may be fabricated. The insulative gluing material may be printed at the peripheries of the first electrically conducting sites on the first sheet member by using the printing screen by modes such as screen printing and ink-jet printing, to form the gluing and insulating space rings.

In an embodiment of the present disclosure, if the gluing and insulating space rings are provided at the peripheries of the first electrically conducting sites, then the process may include firstly printing the electrically conductive material onto the first electrically conducting sites of the first sheet member to form the electrically conducting protrusions, and then printing at the peripheries of the first electrically conducting sites of the first sheet member to form the gluing and insulating space rings. Alternatively, the process may include firstly printing at the peripheries of the first electrically conducting sites of the first sheet member to form the gluing and insulating space rings, and then printing the electrically conductive material onto the first electrically conducting sites of the first sheet member to form the electrically conducting protrusions. Those are not particularly limited in the embodiments of the present disclosure.

In an embodiment of the present disclosure, it should be noted that, before the second time of printing, the firstly printed components may be dried, whereby they have certain surface dryness and hardness, and thus do not contaminate the screen or collapse, which can prevent that, in the second time of printing, the firstly printed components are pressed to collapse and diffuse to the surrounding areas to form defects such as short circuiting and contamination.

For example, if the gluing and insulating space rings are provided at the peripheries of the first electrically conducting sites, if the electrically conducting protrusions are printed firstly, before the printing of the gluing and insulating space rings, the electrically conducting protrusions may be dried. If the gluing and insulating space rings are printed firstly, before the printing of the electrically conducting protrusions, the gluing and insulating space rings may be dried.

In an embodiment of the present disclosure, the printing supporting substrate may be heated, or the electrically conducting protrusions or the gluing and insulating space rings may be locally heated, or dried by irradiation, or pre-cured. The heating temperature may be 50-100° C., and the heating duration may be 10-300 seconds. Those are not particularly limited in the embodiments of the present disclosure.

In an embodiment of the present disclosure, if the gluing and insulating space rings are provided at the peripheries of the first electrically conducting sites, the electrically conductive material is printed onto the first electrically conducting sites of the first sheet member to form the electrically conducting protrusions, and the peripheries of the first electrically conducting sites of the first sheet member are printed to form the gluing and insulating space rings. By printing the electrically conducting protrusions and the gluing and insulating space rings onto the same one sheet member, the providing of the gluing and insulating space rings surrounding the electrically conducting protrusions is realized simultaneously with the printing, whereby a snap-fitting operation is not required subsequently, to result in a simple operation. Moreover, the formation of the gluing and insulating space rings by printing at the peripheries of the first electrically conducting sites on the first sheet member can usually be realized by one-time printing, and it is not required to perform laser tapping one by one, which has a high production efficiency. Moreover, the gluing and insulating space rings are formed by printing at the peripheries of the electrically conducting protrusions in the printing process, and it is not required to remove the insulative gluing material by tapping, to reduce the cost. Moreover, laser-ablation tapping is not required, which reduces the destroying on the insulative gluing material, and facilitates to improve the insulation reliability, the gluing reliability and so on.

In an embodiment of the present disclosure, optionally, the step 202 may include: by using the encapsulating material and the cover-plate material as a printing supporting substrate, printing the electrically conductive material onto the first electrically conducting sites of the first sheet member, to form the electrically conducting protrusions.

Particularly, the electrically conductive material may be printed onto the first electrically conducting sites of the first sheet member by using the encapsulating material and the cover-plate material that are stacked as the printing supporting substrate, to form the electrically conducting protrusions. Accordingly, after the electrically conducting protrusions have been printed completely, the encapsulating material and the cover-plate material that are stacked are allowed not to be removed, which reduces the steps, which can increase the production efficiency of the back-contacting solar-cell module. If the gluing and insulating space rings are provided at the peripheries of the first electrically conducting sites, the electrically conductive material may be printed onto the first electrically conducting sites of the first sheet member by using the encapsulating material and the cover-plate material that are stacked as the printing supporting substrate, to form the electrically conducting protrusions, and the peripheries of the first electrically conducting sites of the first sheet member may be printed to form the gluing and insulating space rings.

Figure 10:
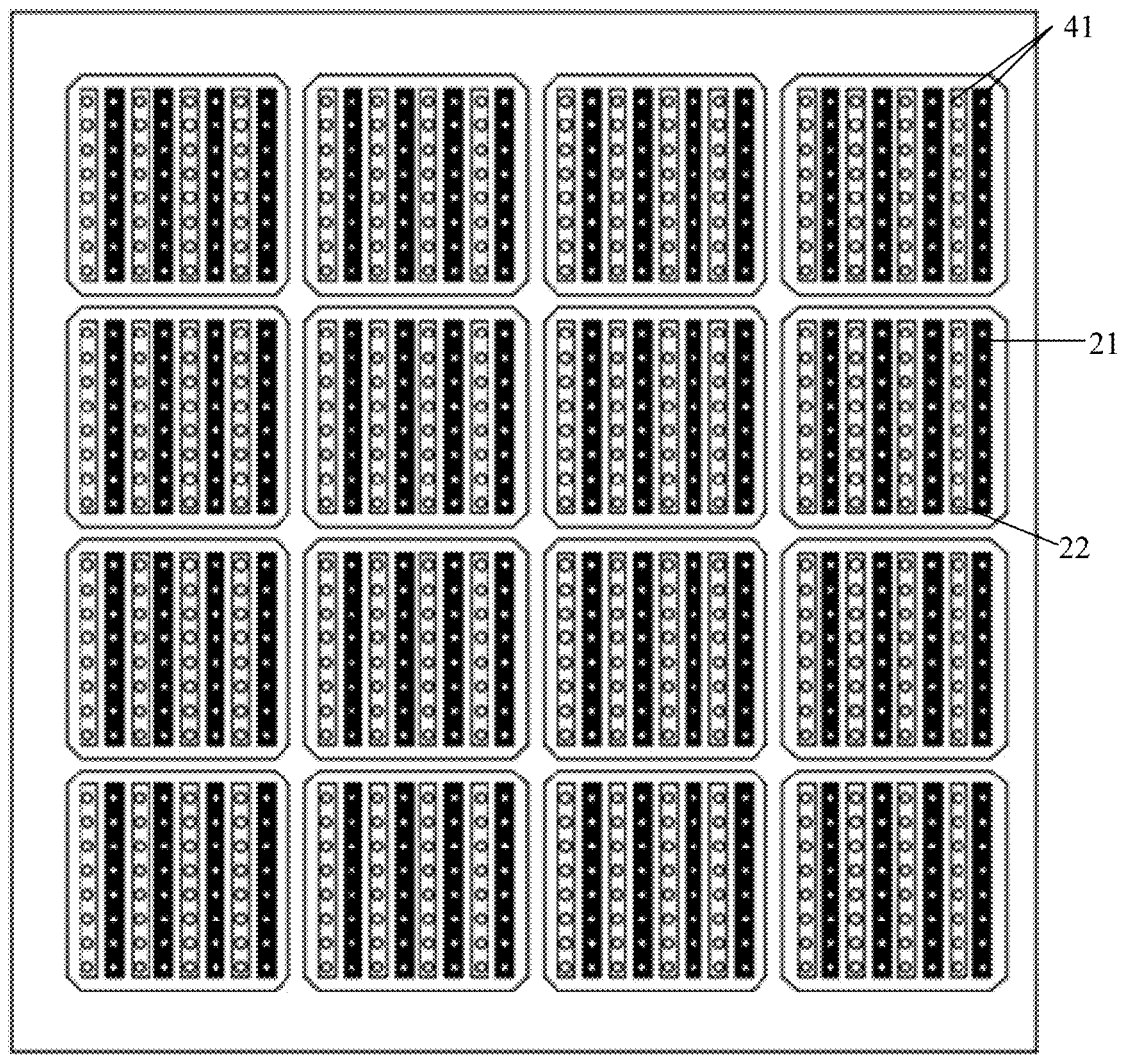
FIG. 10 shows a schematic structural diagram of the formation by printing of the electrically conducting protrusions onto the first electrically conducting sites of the back-contacting solar-cell sheet according to an embodiment of the present disclosure.

Referring to FIG. 10, FIG. 10 shows a schematic structural diagram of the formation by printing of the electrically conducting protrusions onto the first electrically conducting sites of the back-contacting solar-cell sheet according to an embodiment of the present disclosure. In FIG. 10, the electrically conducting protrusions 41 include electrically conducting protrusions electrically contacting the P-type doping diffusing regions 21 and electrically conducting protrusions electrically contacting the N-type doping diffusing regions 22.

Step 203: providing a second stacked member, wherein the second stacked member includes a second sheet member; the second sheet member is the other of the metal circuit board and the back-contacting solar-cell sheet; a surface of the second sheet member is provided with a plurality of second electrically conducting sites; and gluing and insulating space rings are provided at peripheries of the first electrically conducting sites or peripheries of the second electrically conducting sites.

The step 203 may refer to the relevant description on the step 102. It should be noted that the formation of the second electrically conducting sites may refer to the above-described process of the formation of the first electrically conducting sites. Moreover, if the gluing and insulating space rings are provided at the peripheries of the second electrically conducting sites, a space-ring printing screen corresponding to the second electrically conducting sites may be fabricated. The insulative gluing material may be printed onto the second sheet member by using the printing screen by modes such as screen printing and ink-jet printing, to form the gluing and insulating space rings, to obtain the second stacked member. That is equivalent to, in the printing process, leaving the inner rings for subsequently snap-fitting to the electrically conducting protrusions. As compared with the solution in which firstly the full sheet is printed and then tapping is performed one by one to obtain the inner rings, in the present disclosure, the inner rings for subsequently snap-fitting to the electrically conducting protrusions are left in the printing process, and it is not required to perform laser tapping one by one subsequently to form the openings, which has a high production efficiency. In another aspect, the inner rings for subsequently snap-fitting to the electrically conducting protrusions are left in the printing process, the insulative gluing material is not printed directly at the positions of the inner rings, and it is not required to remove the insulative gluing material by tapping, which reduces the cost. Moreover, laser-ablation tapping is not required, which reduces the destroying on the insulative gluing material, and facilitates to improve the insulation reliability, the gluing reliability and so on.

In an embodiment of the present disclosure, the step 201 to the step 202 may be executed synchronously with the step 203 or executed sequentially with the step 203, wherein the execution order is not particularly limited.

Step 204: spray-coating a soldering flux onto a surface of the electrically conducting protrusions.

In an embodiment of the present disclosure, by spray-coating a soldering flux onto the surfaces of the electrically conducting protrusions, in the subsequent laminated solidification, the electrically conducting protrusions and the second electrically conducting sites of the second sheet member can have a good pressing contact therebetween, and defects such as bad contact do not happen, which improves the electric conduction performance of the back-contacting solar-cell module.

Step 205: stacking and laminating the first stacked member and the second stacked member, so that the electrically conducting protrusions abut the second electrically conducting sites, and the gluing and insulating space rings glue the first sheet member and the second sheet member together.

In an embodiment of the present disclosure, the step 205 may refer to the description on the step 103, and, in order to avoid replication, is not discussed here further.

As compared with the prior art, in which the electric connection and the gluing between the metal circuit board and the back-contacting solar-cell sheet are realized by using a conductive adhesive in the lamination process, and the electric connection is realized mainly by the fusion of the conductive adhesive with the metal circuit board and the back-contacting solar-cell sheet in the lamination process, whereby the electric connection has a low reliability and a low yield. In the present disclosure, the first stacked member includes the electrically conducting protrusions that are formed on the first electrically conducting sites of the first sheet member, and the electric connection between the metal circuit board and the back-contacting solar-cell sheet is realized mainly by the stacking of the first stacked member and the second stacked member and the abutting of the electrically conducting protrusions to the second electrically conducting sites of the second sheet member, whereby a stable electric connection can be realized substantially without the fusion, which improves the reliability and the yield of the electric connection. In the lamination process, by pressing the first stacked member and the second stacked member, the electrically conducting protrusions and the second electrically conducting sites can be pressed tighter, which further improves the reliability and the yield of the electric connection. Moreover, all of the electrically conducting protrusions and the gluing and insulating space rings are formed by printing, which has a simple process and a high production efficiency. By printing the electrically conducting protrusions and the gluing and insulating space rings onto the same one sheet member, the providing of the gluing and insulating space rings surrounding the electrically conducting protrusions is realized simultaneously with the printing, whereby a snap-fitting operation is not required subsequently, to result in a simple operation. Moreover, the formation of the gluing and insulating space rings by printing at the peripheries of the first electrically conducting sites on the first sheet member can usually be realized by one-time printing, and it is not required to perform laser tapping one by one, which has a high production efficiency. Moreover, the gluing and insulating space rings are formed by printing at the peripheries of the electrically conducting protrusions in the printing process, and it is not required to remove the insulative gluing material by tapping, to reduce the cost. Moreover, laser-ablation tapping is not required, which reduces the destroying on the insulative gluing material, and facilitates to improve the insulation reliability, the gluing reliability and so on.

It should be noted that, regarding the process embodiments, for brevity of the description, all of them are expressed as the combination of a series of actions, but a person skilled in the art should know that the embodiments of the present disclosure are not limited by the sequences of the actions that are described, because, according to the embodiments of the present disclosure, some of the steps may have other sequences or be performed simultaneously. Secondly, a person skilled in the art should also know that all of the embodiments described in the description are preferable embodiments, and not all of the actions that they involve are required by the embodiments of the present disclosure.

In an embodiment of the present disclosure, there is further provided a back-contacting solar-cell module. Referring to FIG. 7, the back-contacting solar-cell module may include: a first stacked member and a second stacked member.

The first stacked member includes a first sheet member. The first sheet member is one of the metal circuit board 50 and the back-contacting solar-cell sheet 30. The surface of the first sheet member is provided with a plurality of the first electrically conducting sites. The first stacked member further includes the electrically conducting protrusions 41 that are formed on the first electrically conducting sites of the first sheet member.

The second stacked member includes a second sheet member. The second sheet member is the other of the metal circuit board 50 and the back-contacting solar-cell sheet 30 than the first sheet member. The surface of the second sheet member is provided with a plurality of the second electrically conducting sites. The gluing and insulating space rings 40 are provided at the peripheries of the first electrically conducting sites, or, the gluing and insulating space rings 40 are provided at the peripheries of the second electrically conducting sites.

The first stacked member and the second stacked member are stacked and laminated together, and the electrically conducting protrusions 41 abut the second electrically conducting sites. The first sheet member and the second sheet member are glued together by the gluing and insulating space rings 40.

The back-contacting solar-cell module may refer to the above relevant description on the method for producing a back-contacting solar-cell module, to obtain the same technical effect, which, in order to avoid replication, is not discussed here further.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Some or all of the modules may be selected according to the actual demands to realize the purposes of the solutions of the embodiments. A person skilled in the art can understand and implement the technical solutions without paying creative work.

Each component embodiment of the present disclosure may be implemented by hardware, or by software modules that are operated on one or more processors, or by a combination thereof. A person skilled in the art should understand that some or all of the functions of some or all of the components of the calculating and processing device according to the embodiments of the present disclosure may be implemented by using a microprocessor or a digital signal processor (DSP) in practice. The present disclosure may also be implemented as apparatus or device programs (for example, computer programs and computer program products) for implementing part of or the whole of the method described herein. Such programs for implementing the present disclosure may be stored in a computer-readable medium, or may be in the form of one or more signals. Such signals may be downloaded from an Internet website, or provided on a carrier signal, or provided in any other forms.

Figure 11:
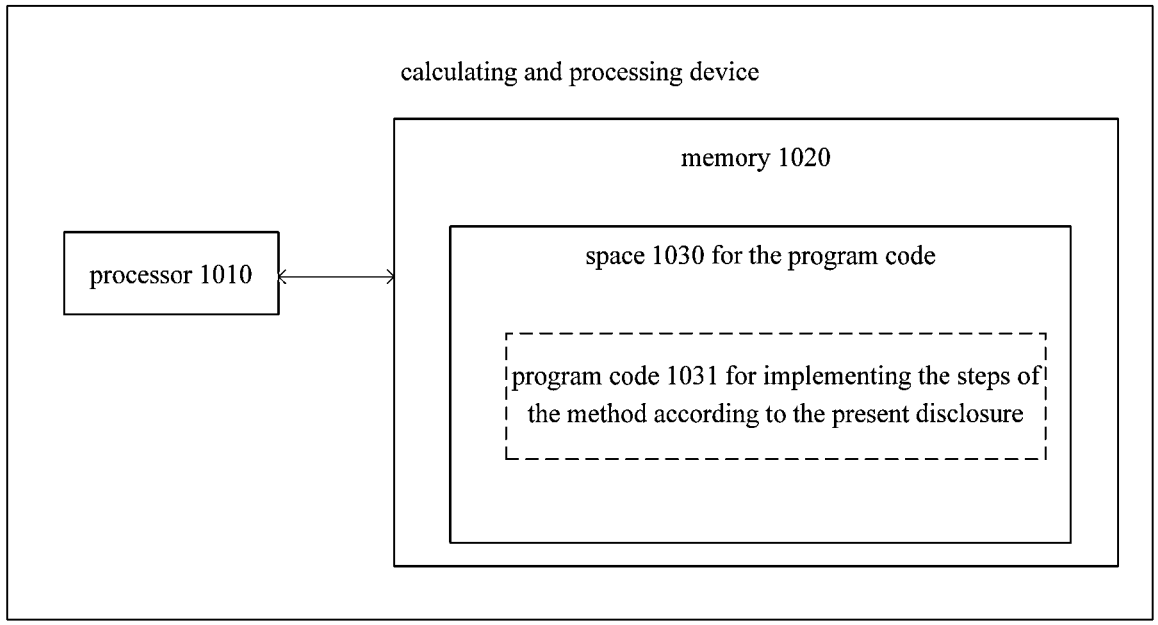
FIG. 11 schematically shows a block diagram of a calculating and processing device for implementing the method according to the present disclosure.
Figure 12:
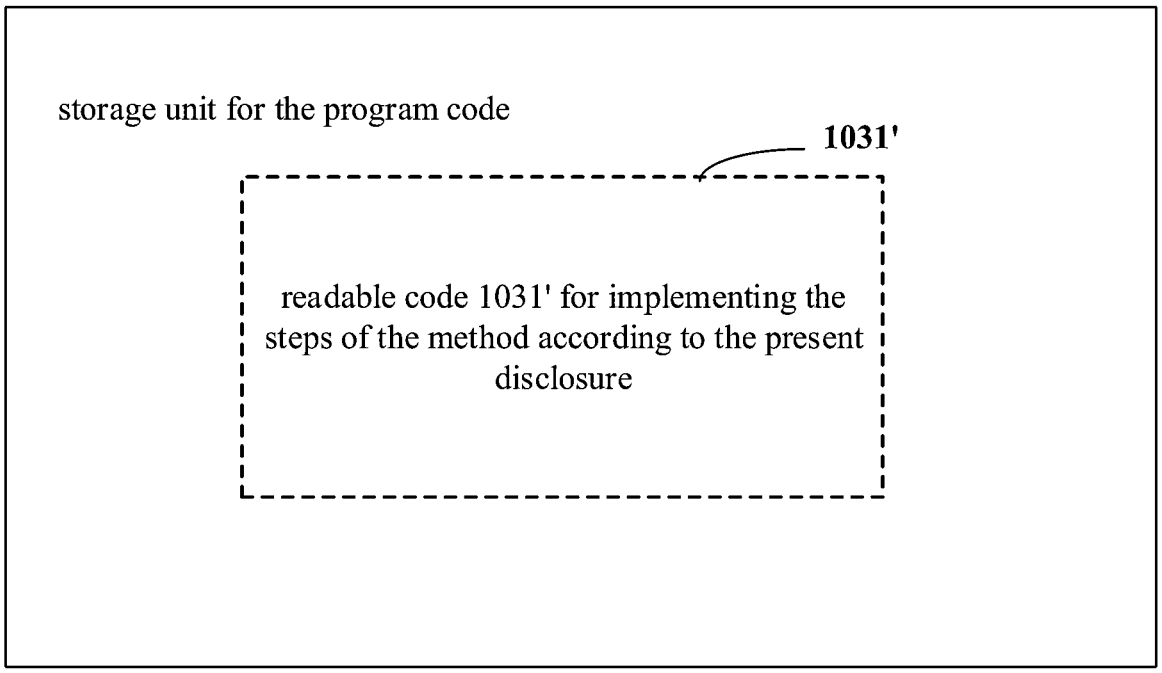
FIG. 12 schematically shows a storage unit for maintaining or carrying a program code for implementing the method according to the present disclosure.

For example, FIG. 11 shows a calculating and processing device that can implement the method according to the present disclosure. The calculating and processing device traditionally includes a processor 1010 and a computer program product or computer-readable medium in the form of a memory 1020. The memory 1020 may be electronic memories such as flash memory, EEPROM (Electrically Erasable Programmable Read Only Memory), EPROM, hard disk or ROM. The memory 1020 has the storage space 1030 of the program code 1031 for implementing any steps of the above method. For example, the storage space 1030 for program code may contain program codes 1031 for individually implementing each of the steps of the above method. Those program codes may be read from one or more computer program products or be written into the one or more computer program products. Those computer program products include program code carriers such as a hard disk, a compact disk (CD), a memory card or a floppy disk. Such computer program products are usually portable or fixed storage units as shown in FIG. 12. The storage unit may have storage segments or storage spaces with similar arrangement to the memory 1020 of the calculating and processing device in FIG. 11. The program codes may, for example, be compressed in a suitable form. Generally, the storage unit contains a computer-readable code 1031', which can be read by a processor like 1010. When those codes are executed by the calculating and processing device, the codes cause the calculating and processing device to implement each of the steps of the method described above.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise or include" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A method for producing a back-contacting solar-cell module, wherein the method comprises:
    providing a first stacked member, wherein the first stacked member comprises a first sheet member; the first sheet member is one of a metal circuit board or a back-contacting solar-cell sheet; a surface of the first sheet member is provided with a plurality of first electrically conducting sites; and the first stacked member further comprises electrically conducting protrusions that are formed on the first electrically conducting sites of the first sheet member;
    providing a second stacked member, wherein the second stacked member comprises a second sheet member; the second sheet member is another of the metal circuit board and the back-contacting solar-cell sheet; a surface of the second sheet member is provided with a plurality of second electrically conducting sites; and gluing and insulating space rings are provided at peripheries of the first electrically conducting sites or peripheries of the second electrically conducting sites; and
    stacking and laminating the first stacked member and the second stacked member, so that the electrically conducting protrusions abut and electrically connect the second electrically conducting sites without fusion, and the gluing and insulating space rings glue the first sheet member and the second sheet member together.

2. The method according to claim 1, wherein a material of the gluing and insulating space rings is an insulative gluing material;
    the insulative gluing material comprises a liquid binder and an inert filler; and
    the inert filler comprises a silicon-dioxide particle.

3. The method according to claim 2, wherein the silicon-dioxide particle is a gas-phase silicon-dioxide particle.

4. The method according to claim 2, wherein the liquid binder comprises a siloxane; and
    a mass ratio of the inert filler to the liquid binder is 7:3 to 3:7.

5. The method according to claim 1, wherein the first stacked member is obtained by using the following steps:
    providing the first sheet member; and
    printing an electrically conductive material onto the first electrically conducting sites of the first sheet member, to form the electrically conducting protrusions.

6. The method according to claim 1, wherein before the step of stacking and laminating the first stacked member and the second stacked member, the method further comprises:
    printing at the peripheries of the first electrically conducting sites of the first sheet member to form the gluing and insulating space rings; or, printing at the peripheries of the second electrically conducting sites of the second sheet member to form the gluing and insulating space rings.

7. The method according to claim 1, wherein a thickness of the gluing and insulating space rings is 1 to 100 micrometers.

8. The method according to claim 1, wherein before the step of stacking and laminating the first stacked member and the second stacked member, the method further comprises:
    spray-coating a soldering flux onto a surface of the electrically conducting protrusions.

9. The method according to claim 1, wherein neighboring instances of the gluing and insulating space rings have a gap therebetween.

10. The method according to claim 5, wherein before the step of printing the electrically conductive material onto the first electrically conducting sites of the first sheet member, to form the electrically conducting protrusions, the method further comprises:
stacking sequentially an encapsulating material and a cover-plate material on a first side of the first sheet member, wherein the first side is opposite to one side of the first sheet member that is provided with the first electrically conducting sites; and
the step of printing the electrically conductive material onto the first electrically conducting sites of the first sheet member, to form the electrically conducting protrusions comprises:
by using the encapsulating material and the cover-plate material as a printing supporting substrate, printing the electrically conductive material onto the first electrically conducting sites of the first sheet member, to form the electrically conducting protrusions.

11. A back-contacting solar-cell module, wherein the back-contacting solar-cell module comprises: a first stacked member and a second stacked member;
the first stacked member comprises a first sheet member;
the first sheet member is one of a metal circuit board or a back-contacting solar-cell sheet;
a surface of the first sheet member is provided with a plurality of first electrically conducting sites;
the first stacked member further comprises electrically conducting protrusions that are formed on the first electrically conducting sites of the first sheet member;
the second stacked member comprises a second sheet member;
the second sheet member is another of the metal circuit board and the back-contacting solar-cell sheet;
a surface of the second sheet member is provided with a plurality of second electrically conducting sites;
gluing and insulating space rings are provided at peripheries of the first electrically conducting sites or peripheries of the second electrically conducting sites;
the first stacked member and the second stacked member are stacked and laminated together, and the electrically conducting protrusions abut and electrically connect the second electrically conducting sites without fusion; and
the first sheet member and the second sheet member are glued together by using the gluing and insulating space rings.

12. The method according to claim 3, wherein the liquid binder comprises a siloxane; and
a mass ratio of the inert filler to the liquid binder is 7:3 to 3:7.

13. The method according to claim 2, wherein the first stacked member is obtained by using the following steps:
providing the first sheet member; and
printing an electrically conductive material onto the first electrically conducting sites of the first sheet member, to form the electrically conducting protrusions.

14. The method according to claim 3, wherein the first stacked member is obtained by using the following steps:
providing the first sheet member; and
printing an electrically conductive material onto the first electrically conducting sites of the first sheet member, to form the electrically conducting protrusions.

15. The method according to claim 4, wherein the first stacked member is obtained by using the following steps:
providing the first sheet member; and
printing an electrically conductive material onto the first electrically conducting sites of the first sheet member, to form the electrically conducting protrusions.

16. The method according to claim 2, wherein before the step of stacking and laminating the first stacked member and the second stacked member, the method further comprises:
printing at the peripheries of the first electrically conducting sites of the first sheet member to form the gluing and insulating space rings; or, printing at the peripheries of the second electrically conducting sites of the second sheet member to form the gluing and insulating space rings.

17. The method according to claim 3, wherein before the step of stacking and laminating the first stacked member and the second stacked member, the method further comprises:
printing at the peripheries of the first electrically conducting sites of the first sheet member to form the gluing and insulating space rings; or, printing at the peripheries of the second electrically conducting sites of the second sheet member to form the gluing and insulating space rings.

18. The method according to claim 4, wherein before the step of stacking and laminating the first stacked member and the second stacked member, the method further comprises:
printing at the peripheries of the first electrically conducting sites of the first sheet member to form the gluing and insulating space rings; or, printing at the peripheries of the second electrically conducting sites of the second sheet member to form the gluing and insulating space rings.

19. The method according to claim 2, wherein a thickness of the gluing and insulating space rings is 1 to 100 micrometers.

20. The method according to claim 3, wherein a thickness of the gluing and insulating space rings is 1 to 100 micrometers.

* * * * *